United States Patent
Remondière et al.

(10) Patent No.: US 8,829,639 B2
(45) Date of Patent: Sep. 9, 2014

(54) THERMOELECTRIC DEVICE USING SEMICONDUCTOR TECHNOLOGY

(75) Inventors: Vincent Remondière, Grenoble (FR); Guillaume Savelli, Grenoble (FR); Marc Plissonnier, Eybens (FR); Denis Cottin, Crolles (FR)

(73) Assignees: ST-Ericsson (Grenoble) SAS, Grenoble (FR); Commissariat a l'Energie Atomique et aux Energies Alternatives, Paris (FR)

( * ) Notice: Subject to any disclaimer, the term of this patent is extended or adjusted under 35 U.S.C. 154(b) by 107 days.

(21) Appl. No.: 13/387,821

(22) PCT Filed: Jul. 26, 2010

(86) PCT No.: PCT/EP2010/060820
§ 371 (c)(1),
(2), (4) Date: May 4, 2012

(87) PCT Pub. No.: WO2011/012586
PCT Pub. Date: Feb. 3, 2011

(65) Prior Publication Data
US 2012/0217608 A1    Aug. 30, 2012

(30) Foreign Application Priority Data
Jul. 29, 2009   (FR) ..................................... 09 03721

(51) Int. Cl.
*H01L 31/058*   (2006.01)
*H01L 35/32*   (2006.01)
*H01L 35/28*   (2006.01)

(52) U.S. Cl.
CPC ................ *H01L 35/32* (2013.01); *H01L 35/28* (2013.01)
USPC ...................... 257/467; 438/54; 257/E29.347

(58) Field of Classification Search
CPC ......... H01L 35/00; H01L 35/02; H01L 35/12; H01L 35/14; H01L 35/28; H01L 35/30; H01L 35/32; H01L 35/34

USPC ............................. 257/467, E29.347; 438/54
See application file for complete search history.

(56) References Cited

U.S. PATENT DOCUMENTS 8,129,609 B2 *   3/2012   Chen et al. ..................... 136/224
8,169,045 B2 *   5/2012   Dibra et al. ................... 257/467
(Continued)

FOREIGN PATENT DOCUMENTS

| CN | 2590169 Y | 12/2003 |
| CN | 1773740 A | 5/2006 |
| JP | A-04-335560 | 11/1992 |
| JP | A-2002-148288 | 5/2002 |
| JP | A-2006-269835 | 10/2006 |

OTHER PUBLICATIONS

Aldrete-Vidrio et al., "Differential Temperature Sensors Fully Compatible With a 0.35-μm CMOS Process," *IEE Transactions on Components and Packaging Technologies*, 2007, vol. 30, No. 4, pp. 618-626.

(Continued)

*Primary Examiner* — Thao X Le
*Assistant Examiner* — Gardner W Swan
(74) *Attorney, Agent, or Firm* — Oliff PLC

(57) ABSTRACT

An integrated thermoelectric device in semiconductor technology comprising a hot side arranged in proximity to a heat source, and a cold side, providing a signal according to the temperature difference between the hot and cold sides. The hot and cold sides are arranged in such a way that their temperatures tend to equal out when the temperature of the heat source varies, i.e. when the sensor is in poor operating conditions. A measuring circuit provides useful information according to a continuously variable portion of the signal from a time when the temperature of the heat source varies. If the temperature of the heat source ceases to vary, the temperatures of the hot and cold sides eventually equal out and the signal is annulled and ceases to vary. The distance between the hot and cold sides can be less than 100 μm.

11 Claims, 5 Drawing Sheets

(56) References Cited

U.S. PATENT DOCUMENTS

2006/0102223 A1 5/2006 Chen et al.
2006/0214693 A1 9/2006 Nakano

OTHER PUBLICATIONS

Lee et al., "Fabrication of Thermoelectric Sensor Using Silicon-on-Insulator Structure," *Japanese Journal of Applied Physics*, 2007, vol. 46, No. 11, pp. 7232-7236.

International Search Report in International Application No. PCT/EP2010/060820; dated Sep. 6, 2010 (with English-language translation).

Translation of Chinese Office Action issued in Chinese Patent Application No. 201080043429.9 dated Mar. 14, 2014.

English translation of Jun. 17, 2014 Office Action issued in Japanese Patent Application No. 2012-522137.

\* cited by examiner

THERMOELECTRIC DEVICE USING SEMICONDUCTOR TECHNOLOGY

BACKGROUND OF THE INVENTION

The invention relates to an integrated thermoelectric device, in particular a Seebeck effect device, in semiconductor technology,

STATE OF THE ART

Numerous integrated circuits nowadays contain embedded thermal sensors to provide information on heat rise of the circuits. A power management circuit will for example be able to stop a function, slow a clock down, or trigger a fan, when the temperature of the sensor reaches a threshold.

Thermal sensors used at present in integrated circuits are generally in the form of a forward-biased p-n junction. The voltage at the terminals of the diode is indicative of the temperature of the junction.

Such sensors present the drawback of consuming a permanent current, of about 20 μA, and above all of not being very precise on the threshold temperature (estimated at +/−20° C.). Although they are commonly used at the present time in mobile equipment, the limits of use of these sensors are starting to become apparent on account of the ever-increasing power dissipation in the housings, related to incorporation of faster or novel functions.

Autonomous sensors exist that are more precise and do not consume current, called Seebeck effect sensors. They are also known under the name of "thermocouples". These thermal sensors are differential and require a cold source and a hot source to be available at the same time.

FIG. 1 represents an integrated differential sensor with Seebeck effect in CMOS technology, as described in the article entitled "Differential Temperature Sensors in 0.35 μm CMOS Technology", published at the Therminic 2005 Conference by Eduardo Aldrete-Vidrio, Diego Mateo, and Josep Altet.

Several parallel conducting bars were formed on a silicon substrate. One end of these bars is located at the level of a cold source (on the left) and the other end is located at the level of a hot source (on the right). The bars are electrically connected in series by metallizations 10. The bars of odd rank 12 and the bars of even rank 14 are of different natures, the ones being made from polycrystalline silicon "poly1" and the others from polycrystalline silicon "poly2" or formed by a p+ implantation of the substrate. Several thermocouples are thus formed at the level of metallizations 10, connected in series in order to increase the sensitivity of the sensor. This arrangement is also called "thermopile".

The length of the thermopile is about 500 μm and its width is about 16 μm.

The voltage U at the terminals of the sensor, supplied to a measuring circuit 15, is proportional to the temperature difference between the thermocouples situated on the hot source side and the thermocouples situated on the cold source side (for the sake of simplification in the following we will refer to hot and cold sides of the sensor). The proportionality coefficient is itself proportional to the number of thermocouples and to the Seebeck coefficient of the pair of materials used for the bars.

FIG. 2 represents an example of transient variation of the temperature of the hot side Th of a thermopile in response to an ideal power step P dissipated by the hot source.

Temperature Th increases progressively and tends asymptotically to the temperature value corresponding to thermodynamic equilibrium. The rate of increase depends on the power and the thermal capacity of the hot source. The maximum value depends on the power and the capacity of the hot source to remove heat.

In the case where temperature Tc of the cold side does not vary, the voltage at the terminals of the sensor is directly indicative of the temperature variations of the hot source Th.

The above-mentioned article describes this kind of sensor in the context of characterization of the thermal behaviour of functional units on a chip, and proposes integrating it in series of circuits dedicated to thermal characterization. On account of the size of the sensor (about 8,000 μm$^2$), it cannot be used as-is in commercial integrated circuits, which have hot sources (power transistors) with a typical size of about 150,000 μm$^2$ (the sensor would occupy 5% of the surface of the power transistor).

SUMMARY OF THE INVENTION

A need has been observed for a thermal sensor that is both precise, has a low consumption, and has a size making it suitable for use in commercial integrated circuits.

To meet this requirement, an integrated thermoelectric device in semiconductor technology is in particular provided comprising a hot side arranged in proximity to a heat source, and a cold side, providing a signal according to the temperature difference between the hot and cold sides. The hot and cold sides are arranged in such a way that their temperatures tend to equal out when the temperature of the heat source varies, i.e. when the sensor is in poor operating conditions. A measuring circuit provides useful information according to a continuously variable portion of the signal from a time when the temperature of the heat source varies. If the temperature of the heat source ceases to vary, the temperatures of the hot and cold sides eventually equal out and the signal is annulled and ceases to vary. The distance between the hot and cold sides can be less than 100 μm.

BRIEF DESCRIPTION OF THE DRAWINGS

Other advantages and features will become more clearly apparent from the following description of particular embodiments given for non-restrictive example purposes only and illustrated by means of the appended drawings, in which.

DESCRIPTION OF A PREFERRED EMBODIMENT OF THE INVENTION

In order to benefit from the advantages of a Seebeck effect thermal sensor, or differential sensor, in a commercial integrated circuit, it is desirable to reduce its overall size. The width of the sensor being able to be dictated by the dimensions of the technology and by the number of junctions enabling the required sensitivity to be achieved, the only latitude is to be found on the length of the sensor. In current technologies, this length is required to be less than 100 µm, preferably less than 50 µm, i.e. five to ten times less than the length of the conventional sensor described in relation with FIG. 1.

However, reducing the length of the sensor involves locating the hot and cold sources closer to one another, which gives rise to drawbacks which have not been able to be solved up to now.

Figure 1:
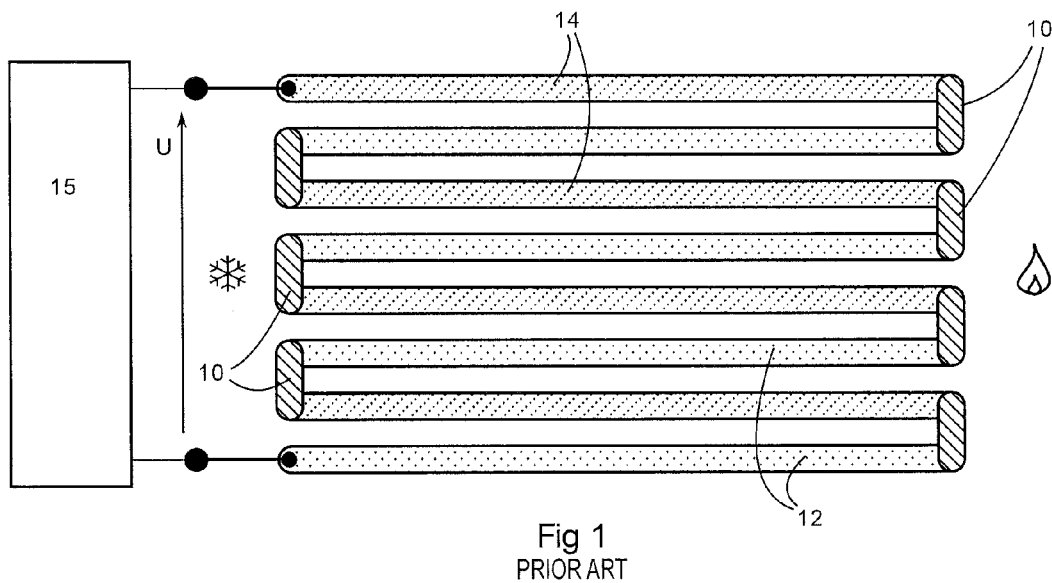
FIG. 1, described in the foregoing, represents a conventional integrated differential thermal sensor with Seebeck effect in CMOS technology.
Figure 3:
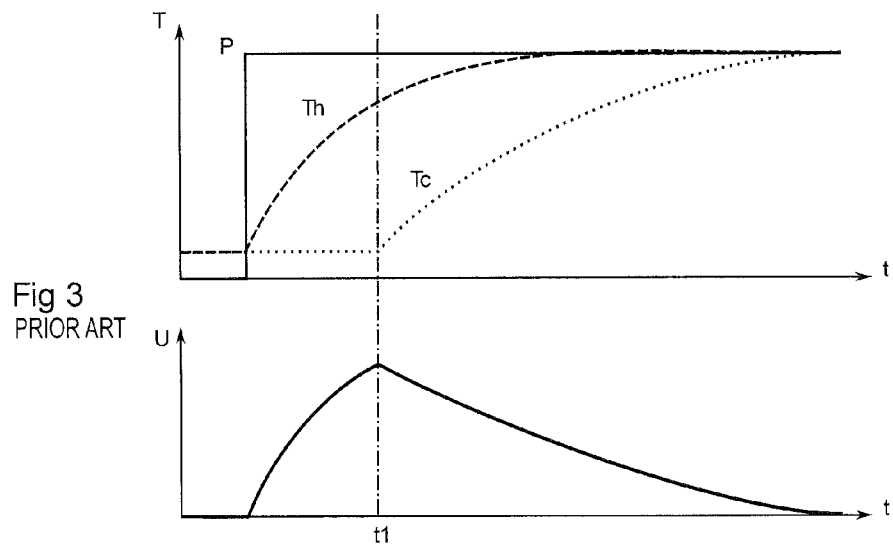
FIG. 3 represents a transient variation of the temperature and of the voltage in a sensor of the type of FIG. 1 in response to a power step, in the case where the cold side Tc cannot be considered as being fixed.

FIG. 3 represents an example of a variation of temperatures and of voltage U at the terminals of a Seebeck-effect thermal sensor of the type of FIG. 1 in response to a power step P applied on the hot source, in an unfavorable situation (non-thermostatic cold side Th). Such a situation is all the more unfavorable the more the length of the sensor is reduced.

Figure 2:
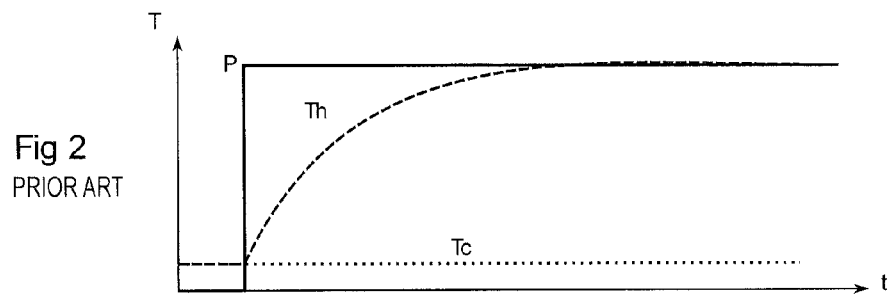
FIG. 2, described in the foregoing, represents a transient variation of the temperature in a sensor of the type of FIG. 1 in response to a power step, in a favorable situation.

Hot side temperature Th varies as in FIG. 2. However, the heat generated at the level of the hot source is transmitted by conduction to the cold source, the temperature Tc of which starts to increase from a time t1, with a certain time lag depending on the length of the sensor and on the thermal characteristics of the material between the hot and cold sources. The increase of temperature Tc is less fast than that of temperature Th, as the heat of the hot source is diffused around this source and only a fraction is diffused to the cold source. Temperature Tc tends asymptotically towards the thermodynamic equilibrium temperature, dependent on the heat removal capacity of the cold source and which, in the worst case represented, is equal to the maximum value of Th.

Up to time t1, voltage U at the terminals of the sensor follows the variation of temperature Th. From time t1, when temperature Tc starts to increase, voltage U starts to decrease progressively towards 0 as temperature Tc approaches temperature Th. With a sensor length of about 50 µm integrated in current technologies, the duration of this pulse of voltage U is about a few microseconds. The sensor therefore becomes inoperable after a few microseconds and is unable perform the measurements referred to in the state of the art.

In fact, if the heating phenomena of an area corresponding to a functional unit of an integrated circuit is analyzed more closely, it can be observed that the temperature under steady conditions of this area is established at the mean temperature of the individual devices which heat it, in particular the power transistors constituting the functional unit. These power transistors generally operate in chopped mode, that is to say they alternately present turn-on and turn-off phases at high frequency, respectively corresponding to heating and cooling phases. Even if the mean temperature of the area is constant, it can be seen that the temperature at the level of the power transistors varies perceptibly at the chopping frequency.

Thus, to make a differential sensor of small size usable, its hot side is placed in immediate proximity to a power transistor responsible for a temperature increase, or which has a temperature increase which it is required to measure. The cold side is placed away from the transistor, preferably in an area which is not affected by another power transistor and if possible close to a ground connector connected to the conducting ground plane of the circuit in order to benefit from a greater thermal inertia. Then, instead of measuring a continuous temperature differential under steady conditions, the transient amplitude of the temperature differential is measured.

Figure 4A:
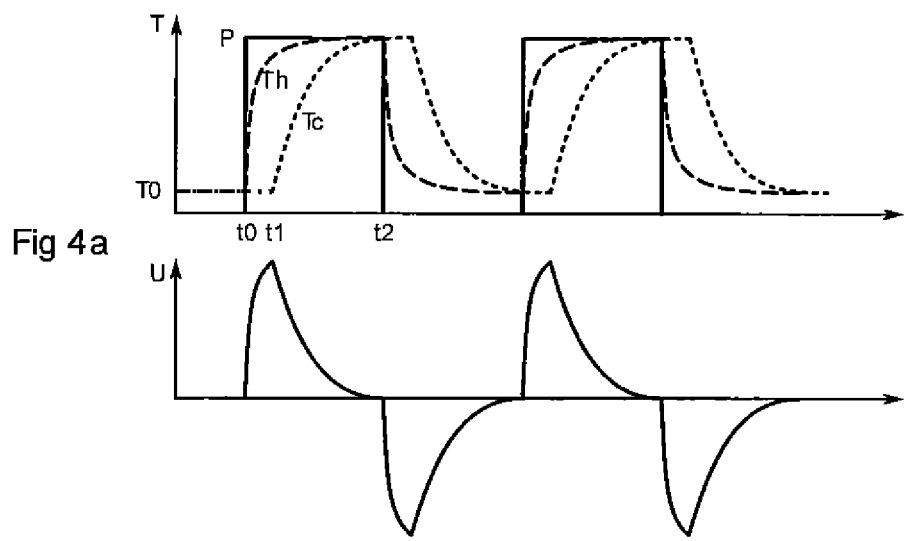
FIGS. 4a, 4b and 4c represent transient variations of temperatures and of voltage in a differential thermal sensor of small size, in three particular operating modes.

FIG. 4a represents an example of variation of hot side temperature Th and cold side temperature Tc and of corresponding voltage U at the terminals of the sensor in the case where the chopping turn-on phase is substantially equal to the time taken by temperatures Tc and Th to reach the same level after turn-on of the transistor.

At a time t0, the transistor is turned-on, which corresponds to application of a power step P. Temperatures Th and Tc and voltage U vary as in FIG. 3, starting from an equilibrium temperature T0 corresponding to the mean temperature of the area.

At a time t2, shortly after temperature Tc has joined temperature Th at its maximum value and voltage U has dropped back to 0, the transistor is turned off. The trend of temperatures Th and Tc is reversed, instantaneously for temperature Th and with a time lag for temperature Tc, the same time lag as in the turn-on phase of the transistor.

Voltage U presents a series of alternately positive and negative pulses, the peak values of which are easily measured to determine the heating conditions of the transistor. The peak value of voltage U does not directly indicate the temperature increase attained by the transistor, as the temperature increase of the cold source will have to be added to this. This peak value is nevertheless representative of the variation of the temperature difference (Th-Tc) with time.

If it is required to know the temperature increase of the transistor at the end of the turn-on phase, the latter can be extrapolated from the curve of voltage U at the beginning of each switching phase, as, so long as the cold side temperature Tc has not started to change significantly (time t1), voltage U is directly representative of the variation of hot side temperature Th. For the requirements of such an extrapolation, time t1 is identifiable on signal U by the fact that signal U reaches its peak value.

If the chopping frequency decreases, the pulses of voltage U will have substantially the same amplitude and aspect, but they will be spaced further apart.

Figure 4B:
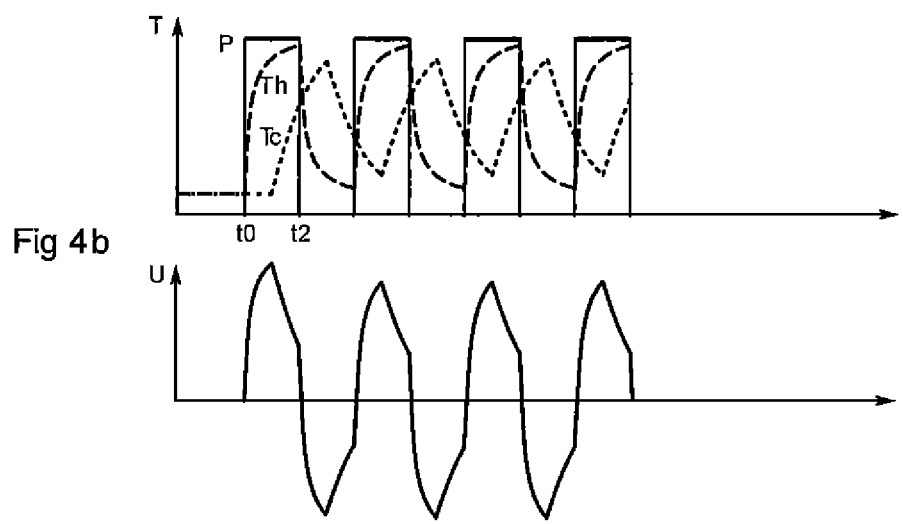

FIG. 4b represents a situation where the chopping frequency is higher than in the case of FIG. 4a. At time t2 when the transistor is off, neither of temperatures Th and Tc has reached its maximum value. Hot side temperature Th immediately begins to decrease tending asymptotically towards the initial temperature T0. Cold side temperature Tc on the other hand, which reacts with a time lag with respect to the variation of temperature Th, continues to increase during the time lag period, then starts to decrease tending asymptotically towards the initial temperature. The variation becomes periodic after a few starting cycles.

Voltage U, proportional to the difference of temperatures Th and Tc, presents a symmetric alternative aspect. It can be observed that the peak values of the signal are lower than those of FIG. 4a. The peak values decrease when the chopping frequency increases from the situation of FIG. 4a, which shows the maximum chopping frequency limit that the sensor is liable to observe taking account of its dimensions and the thermal inertia of the system. The transistors that are to be observed operate rather under the conditions of FIG. 4a, or at a lower chopping frequency.

Figure 4C:
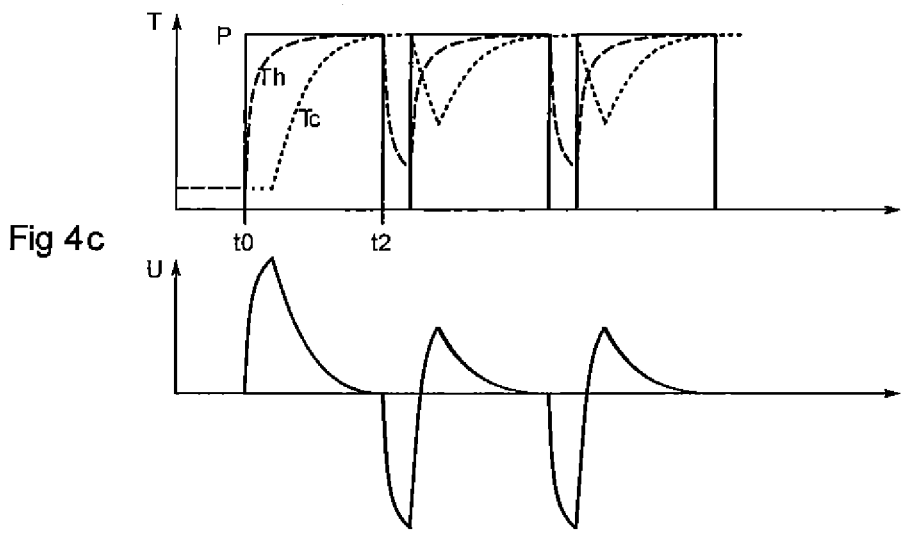

FIG. 4c represents a situation where the chopping duty cycle is close to 1. The turn-on phases of the transistor correspond to those of FIG. 4a, i.e. they are sufficiently long for temperatures Th and Tc to reach their maximum value. The turn-off phases of the transistor are close to the time lag of variation of cold side temperature Tc.

During the first turn-on phase starting at time t0 and the first turn-off phase starting at time t2, temperatures Th, Tc and voltage U vary as in FIG. 4a.

When the second and subsequent turn-on phases take place, cold side temperature Tc has not yet started to decrease. This results in only temperature Th varying during the turn-off phases.

Voltage U varies in dissymmetric manner. It is only representative of temperature Th during the turn-off phases where voltage U presents negative maximum peak values.

In the foregoing description of FIGS. 4a to 4c, initial temperature T0 is assumed to be constant. This is the case under steady operating conditions where the circuit has reached its mean operating temperature. Under transient conditions, for example on power-on of the circuit, each turn-on phase contributes to increasing temperature T0 from the ambient temperature.

A differential thermal sensor as described herein is not suitable for direct determination of the absolute thermal conditions of a transistor. However, in a large number of conceivable power management applications, knowing the temperature variations is not sufficient to deduce trends and take the required measures to modify these trends. For example, a condition requiring a power reduction can be detected from the fact that voltage U supplied by the sensor increases faster than during the previous turn-on phases of the transistor, or that the variation of voltage U in a turn-on phase exceeds a threshold.

However, if the absolute thermal conditions need to be known, they can be estimated by accumulating the signed variations of the peak values of voltage U since power-on of the circuit. This accumulation is representative of mean temperature T0. For example, if we refer to FIG. 4a, if temperature T0 increases during the first turn-on phase, temperature Th tends to the new value of temperature T0 during the next turn-off phase. This results in the peak value of voltage U during this phase being lower in absolute value than the peak value of the previous phase, and the difference of these peak values (in absolute value) is representative of the increase of temperature T0.

To be more precise, rather than accumulating the differences of peak values, the differences of the asymptotic values can be accumulated, the latter being calculated by extrapolating the curve of voltage U at the beginning of each phase, between times t0 and t1.

A measuring circuit using signal U will be able to be designed by persons skilled in the trade according to their requirements. It can be associated with a computer if trends are to be extrapolated. A microcontroller existing to manage other functions of the integrated circuit, for example power management, can be programmed to perform the necessary calculations and carry out the required actions.

Figure 5:
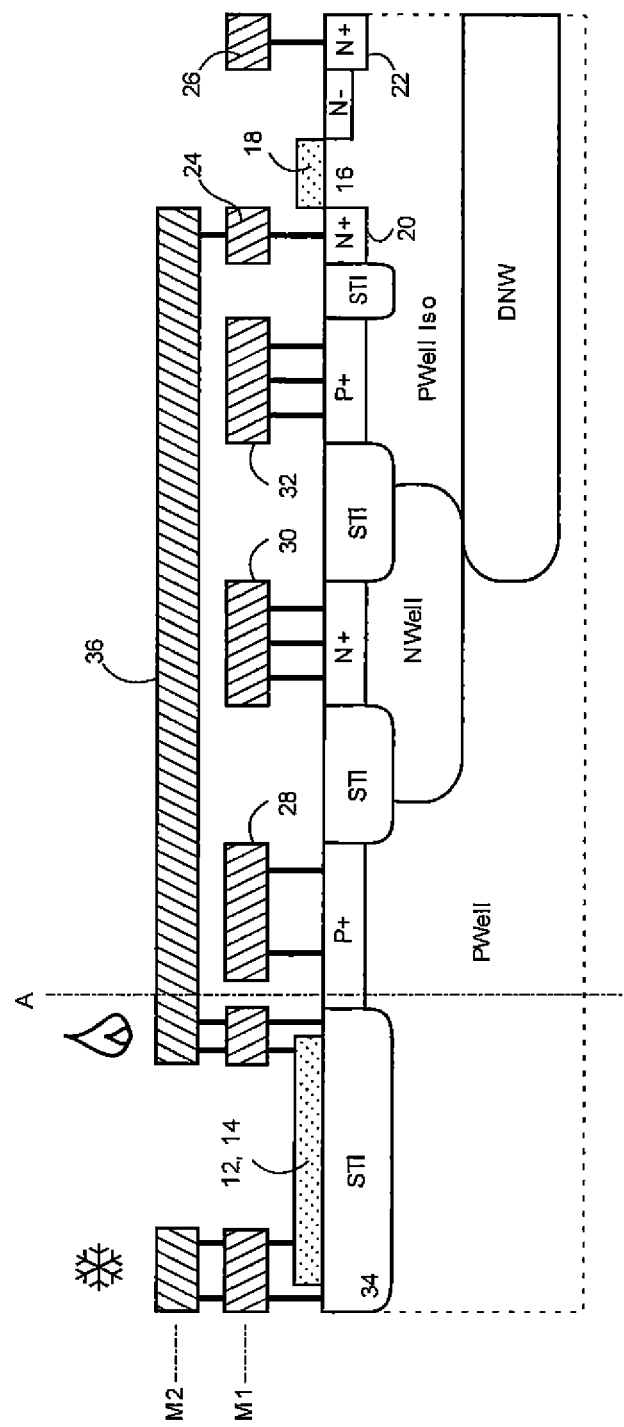
FIG. 5 represents a differential thermal sensor of small size arranged in an integrated circuit to measure the temperature of a MOS power transistor.

FIG. 5 represents an example of integration of a differential thermal sensor of small size in immediate proximity to a MOS power transistor the thermal operating conditions of which are to be measured. The transistor is situated to the right of a line A and the sensor is situated to the left.

The integrated circuit is made on a P-conductivity silicon substrate (PWell). The MOS transistor, of N-conductivity, is of conventional design. It comprises a channel 16 covered by a polycrystalline silicon gate 18. The channel is delineated by N+ areas 20 and 22. N+ area 22 can be connected to the channel by an N− "extension" area of smaller thickness, as is represented. Contacts 24 and 26, made in a first interconnection level M1, are connected by vias to N+ areas 20 and 22, and constitute the source and drain electrodes of the transistor.

The P-area underneath channel 16 is configured as an insulated well (PWell Iso). This P-well is delineated by a buried N-well (DNW) and a peripheral N-well (NWell). Contacts 28, 30, and 32, made in interconnection level M1, enable contact to be made with substrate PWell, peripheral well NWell, and insulated P-well (PWell Iso) by means of respective P+, N+ and P+ areas. These various areas are insulated from one another by means of a shallow trench insulator (STI).

The sensor, to the left of line A, comprises a thermopile as described in relation with FIG. 1. Polycrystalline silicon bars 12 and 14 of the sensor are arranged on a shallow trench insulator 34 made in the substrate. This electric insulator also proves to be a thermal insulator limiting transmission of heat between the substrate and sensor, and also between the hot and cold sides of the sensor. Other insulators can be envisaged, such as thick oxide or a nitride.

The cold side of the sensor, on the extreme left of the figure, is preferably coupled by a thermal bridge formed by a stack of vias and metallizations in the successive interconnection levels (only two are represented, M1 and M2) to a metal strip (not shown) on the surface of the chip. This strip can be connected to a heat sink by means of a contact bead. The objective is to thermally couple the cold side of the sensor ideally to a thermostat in order to keep it at a temperature Tc that is as constant as possible. In practice, a contact bead coupled to the ground plane of the circuit can present a good thermal inertia with respect to time necessary for measurement on the sensor. This thermal inertia can also be enhanced by making thermal brakes in the ground plane to separate the power ground connections from the control ground connections as can be achieved by the person skilled in the trade.

The vias, which are made in large number in order to reduce the thermal resistance, do not make any electric contact with bars 12 and 14. They come on insulator 34 all around the ends of the bars to collect the heat. Only the dedicated vias connect the output contacts of the sensor to metal tracks serving the purpose of transmitting voltage U supplied by the sensor to an operating circuit.

The area where the transistor heats is channel 16. The hot side of the sensor therefore has to be placed as close as possible to the channel. But, as represented, this hot side of the sensor can at best be placed in contact with the periphery of the transistor. The sensor must not interfere with the elements constituting the transistor which, in the case of a MOS power transistor, as is represented, place the channel relatively far from the periphery.

To improve heat transmission between channel 16 and the hot side of the sensor, a thermal bridge 36 is preferably provided in the form of a metallization in interconnection level M2 for example. This bridge is connected by means of one end to source electrode 24 of the transistor and by means of the other end to the hot side of the sensor. Connection is made by vias and, if applicable, metallizations of the intermediate interconnection levels (M1 on the sensor side). As for the cold side of the sensor, the vias of thermal bridge 36 come into contact with insulator STI 34 around the ends of bars 12 and 14.

In order for thermal bridge 36 to have an optimal efficiency, its width (non-visible dimension, perpendicular to the plane of the figure) is chosen equal, on the sensor side, to the width of the thermopile and, on the transistor side, to the width of source electrode 24.

As bridge 36 forms a relatively large metallic mass and therefore a high electric capacitance, it has to be connected, on the transistor side, to a contact which undergoes little voltage variation. This is generally the source of the power transistor, which is connected to a supply voltage (ground for N-conductivity transistors, supply voltage for P-conductivity transistors).

In current integration technologies on silicon, the quantity of metal in each interconnection level has to respect a minimum proportion with respect to the insulator filling the gap between the metallizations in order to obtain suitable surface states and homogeneous thicknesses after the planarization operations. In the case of chemical mechanical polishing (CMP), this proportion is about 10 to 15%. This constraint is integrated in integrated circuit design tools so that these tools will automatically add small metal bumps (called dummies) regularly distributed over the surface of an interconnection level when the proportion of metal to be found there is insufficient.

In a sensor as represented in FIG. 5, dummies would inevitably be inserted in each interconnection level between the hot and cold sides of the sensor. These dummies reduce the thermal resistance and enhance heating of the cold side by the hot side. This results in the length of the sensor having to be increased to compensate the decrease of the thermal resistance. Usable results are however obtained with a length of about 100 μm.

Figure 6:
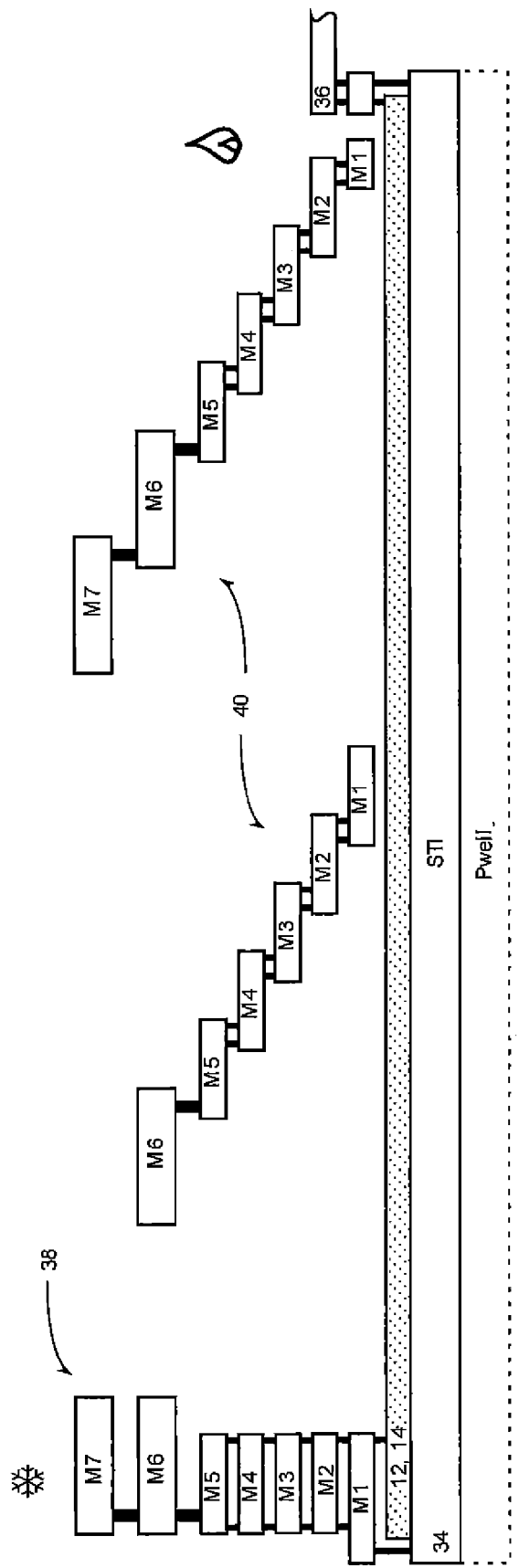
FIG. 6 represents various optimizations able to be applied to a differential thermal sensor of small size.

FIG. 6 represents a structure of a thermal sensor enabling the length to be optimized taking the CMP constraints into account.

One principle used in this structure, is to distribute a minimum of metal, in accordance with the technological requirements of the CMP operation, in judicious manner, so that it is unfavorable for heat transmission between the hot and cold sides of the sensor. The technology used for example comprises seven interconnection levels M1 to M7. In each of these levels, the minimum proportion of metal therefore has to be respected.

On the cold side of the sensor, as stipulated in relation with FIG. 5, a vertical stack of metallizations 38 is provided connected by vias. The metallization of level M1 is connected by vias to insulator STI 34 around the ends of bars 12, 14 of the sensor, without entering into electric contact with the latter, as was stated in relation with FIG. 5. The width of these metallizations, i.e. their dimension perpendicular to the plane of the figure, is about the width of the thermopile constituting the sensor.

The metallization of level M7 is preferably connected to a contact strip accessible from the outside of the integrated circuit, able to be placed directly in contact with a heat sink or be connected by a contact bead to a metal strip of a printed circuit.

On the hot side of the sensor, stepped structures 40 forming a staircase having metal steps are provided in the successive interconnection levels M1 to M7. The first staircase starts at the first level M1 at the hot end of the sensor and extends upwards towards the surface of the chip going towards the cold side. The following staircase starts at level M1 substantially plumb with where the first staircase stops at level M7. With the dimensions represented, this second staircase stops at level M6 so as to remain away from stack 38 on the cold side.

If the sensor was longer, this second staircase would also stop at level M7, and a third staircase would start at level M1 plumb with the last step of the second staircase, and so on until stack 38 is reached.

The steps overlap slightly from one level to the next so as to be able to be connected by vias. The first steps, of level M1, do not comprise vias connecting them in the downwards direction. Moreover the first step of the first staircase, although it is made in the same level M1 as thermal bridge 36, is not connected to the thermal bridge. These staircases are in fact preferably thermally and electrically insulated from the other elements of the integrated circuit.

The depth of the steps is chosen such that the proportion of metal in each level is equal to the minimum required (10 to 15%). For example purposes, in 65 nm CMOS technology, a depth of 2.2 μm can be taken for the steps of levels M6 and M7 (where the metal is thicker), and a depth of 1.6 μm be taken for the others. The second staircase could start 1.2 μm after the last step of the first staircase.

The width of the staircases is about the width of the thermopile constituting the sensor, as is the width of thermal bridge 36.

Stepped structures 40 act as thermal deflectors fostering propagation of heat upwards, away from the cold side of the sensor. Due to this distribution of the metal, a usable sensor thermal with a length of about 20 μm only can be produced.

Figure 7:
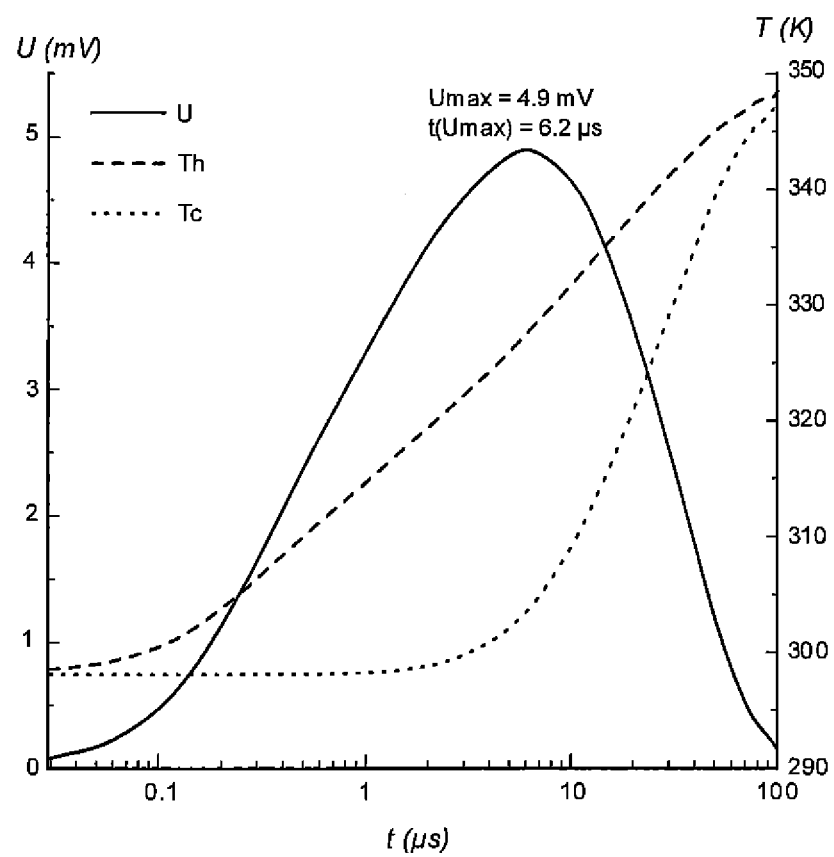
FIG. 7 represents the variation of the temperatures and voltage measured on a particular example of a differential thermal sensor of small size.

FIG. 7 represents a variation of the hot and cold side temperatures Th, Tc and of the voltage U delivered by a prototype of a sensor of the type of FIG. 6 in response to a power step. The thermopile of the sensor only comprises two polycrystalline silicon bars, respectively of n-conductivity and p-conductivity, with a length of 20 μm.

The power step is such that the asymptotic value of the temperature rise is about 50 K. Temperature Th practically reaches this value after 100 μs. Cold side temperature Tc reacts with a time lag of about 6 μs after the beginning of the step. 6.2 μs after the beginning of the step, a maximum voltage U of 4.9 mV is measured. By using a thermopile with 8 bars, this value is multiplied by 4, while at the same time providing a sensor presenting very small dimensions. The number of bars, and therefore the number of junctions of the thermopile, should be chosen according to the sensitivity of the circuit using the sensor output and to the required precision.

The invention claimed is:

1. An integrated circuit in semiconductor technology comprising:
    a functional unit comprising at least one power transistor configured to operate in chopped mode and forming an intermittent heat source with a heating period and a cooling period, and
    a thermoelectric device provided with a hot side arranged in proximity to the heat source, and a cold side, supplying a signal according to the temperature difference between the hot and cold sides, the hot and cold sides being arranged in such a way that their temperatures tend to equal out when the temperature of the heat source varies,
    the thermoelectric device having a voltage comprising alternating positive and negative pulses, and
    a distance between the hot and cold sides being less than 100 μm.

2. The integrated circuit device according to claim 1, comprising a measuring circuit providing information concerning the heating condition of the transistor from the positive and negative pulses.

3. The integrated circuit according to claim 1, wherein the hot side is coupled to the heat source by a thermal bridge made in an interconnection level of the semiconductor technology.

4. The integrated circuit according to claim 1, wherein the thermoelectric device is made on an insulator.

5. The integrated circuit according to claim 1 made in a technology providing several interconnection levels and requiring a minimum proportion of metal per level, comprising a stepped structure starting from the hot side and moving away from a distance between hot and cold sides going towards the cold side, the steps of the structure being made from metal in successive interconnection levels.

6. The integrated circuit according to claim 5, wherein the steps are realized with a minimum distance allowing satisfying a minimum metal proportion requirement per level.

7. The integrated circuit according to claim 1, comprising a thermal bridge connecting the cold side to a strip accessible from outside the integrated circuit.

8. The integrated circuit according to claim 1, wherein the heat source is a transistor operating in chopped mode.

9. The integrated circuit according to claim 3, wherein the thermal bridge comprises vias arranged around one end of the device without coming into electric contact with the device.

10. The integrated circuit according to claim 1, wherein the hot and cold sides being arranged in such a way that the temperature of the hot side is greater than that of the cold side at the end of the heating period and the temperature of the cold side is greater than that of the hot side at the end of the cooling period.

11. An integrated circuit in semiconductor technology comprising:
    a functional unit comprising at least one power transistor configured to operate in chopped mode and forming an intermittent heat source with a heating period and a cooling period; and
    a thermoelectric device provided with a hot side arranged in proximity to the heat source, and a cold side, supplying a signal according to a temperature difference between the hot and cold sides, the hot and cold sides being arranged in such a way that their temperatures tend to equilibrate when the temperature of the heat source varies, wherein
    the hot side is coupled to the heat source by a thermal bridge made in an interconnection level of the semiconductor technology; and
    the thermal bridge comprises vias arranged around one end of the device without coming into electric contact with the device.

* * * * *